United States Patent
Kamimura

(10) Patent No.: US 8,932,479 B2
(45) Date of Patent: Jan. 13, 2015

(54) POLISHING LIQUID AND POLISHING METHOD

(75) Inventor: Tetsuya Kamimura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 477 days.

(21) Appl. No.: 13/071,539

(22) Filed: Mar. 25, 2011

(65) Prior Publication Data

US 2011/0244684 A1 Oct. 6, 2011

(30) Foreign Application Priority Data

Mar. 31, 2010 (JP) ................. 2010-081837

(51) Int. Cl.
| C09K 13/06 | (2006.01) |
| C09K 3/14 | (2006.01) |
| H01L 21/3105 | (2006.01) |
| C09G 1/02 | (2006.01) |

(52) U.S. Cl.
CPC ........ H01L 21/31053 (2013.01); C09K 3/1463 (2013.01); C09G 1/02 (2013.01)
USPC .............. 252/79.4; 252/79.1; 216/2; 438/693

(58) Field of Classification Search
None
See application file for complete search history.

(56) References Cited

U.S. PATENT DOCUMENTS

| 3,138,746 | A * | 6/1964 | Burger et al. ................. 361/506 |
| 3,706,634 | A * | 12/1972 | Kowalski ....................... 205/266 |
| 6,561,876 | B1 | 5/2003 | Tateyama et al. |
| 2005/0204639 | A1* | 9/2005 | Ishihara ........................ 51/308 |
| 2007/0202703 | A1* | 8/2007 | Shimizu et al. .............. 438/692 |
| 2007/0251156 | A1* | 11/2007 | Siddiqui ....................... 51/307 |
| 2010/0009538 | A1 | 1/2010 | Kamimura |
| 2010/0112816 | A1* | 5/2010 | Marxsen et al. ............. 438/692 |
| 2010/0210184 | A1 | 8/2010 | Narita |

FOREIGN PATENT DOCUMENTS

| JP | 2001-009702 | 1/2001 |
| JP | 2005-93816 A | 4/2005 |
| JP | 2005-347579 | 12/2005 |
| JP | 2006-339597 A | 12/2006 |
| JP | 2006-344836 A | 12/2006 |
| JP | 2007-12922 A | 1/2007 |
| JP | 2007-335847 | 12/2007 |
| JP | 2009-289885 | 12/2009 |
| JP | 2010-041037 | 2/2010 |
| WO | 2009/037903 | 3/2009 |

OTHER PUBLICATIONS

Dow, Dowfax Anionic Surfactants for High-Performance Products, Jul. 2000, Dow, p. 1-3.*
Xu et al , Adsorption of Nonionic Surfactants, Anionic/Nonionic Surfactant Mixtures, and Hydrophobically Modified Polymers on Minerals and its Effects on Their Flotation and Dispersion, May 1993, XVIII International Mineral Processing Congress, p. 601-606.*
Partial English language translation of the following: Office action dated Jul. 23, 2013 from the Japanese Patent Office in a Japanese patent application corresponding to the instant patent application. This office action translation is submitted now in order to supplement the understanding of patent documents JP 2009-289885, JP2007-335847, WO2009/037903, JP2010-041037 and JP2005-347579.
Partial English language translation of the following: Office action dated Dec. 3, 2013 from the Japanese Patent Office in a Japanese patent application corresponding to the instant patent application.

* cited by examiner

*Primary Examiner* — Binh X Tran
*Assistant Examiner* — David Cathey, Jr.
(74) *Attorney, Agent, or Firm* — SOLARIS Intellectual Property Group, PLLC

(57) ABSTRACT

Provided is a polishing liquid which is used for chemical mechanical polishing of a body to be polished having a layer containing polysilicon or a modified polysilicon, and using which the polishing rate of a layer containing a silicon-based material other than polysilicon is high and polishing of the layer containing polysilicon can be selectively suppressed. The polishing liquid includes components (A), (B), and (C), has a pH of from 1.5 to 7.0, and is capable of selectively polishing a second layer with respect to a first layer: (A) colloidal silica particles having a negative $\zeta$ potential; (B) phosphoric acid or an organic phosphonic acid compound represented by the following Formula (1) or (2); and (C) an anionic surfactant having at least one group represented by the following Formulae (I) to (IV):

| $R^2—C(R^3)_{3-a}—(PO_3H_2)_a$ | Formula (1): |
| $R^4—N(R^5)_m—(CH_2—PO_3H_2)_n$ | Formula (2): |
| $—PO_3X_2$ | Formula (I): |
| $—OPO_3X_2$ | Formula (II): |
| $—COOX$ | Formula (III): |
| $—SO_3X$ | Formula (IV). |

22 Claims, No Drawings

POLISHING LIQUID AND POLISHING METHOD

CROSS-REFERENCE TO RELATED APPLICATION

This application claims priority under 35 USC 119 from Japanese Patent Application No. 2010-081837 filed on Mar. 31, 2010, the disclosure of which is incorporated by reference herein.

BACKGROUND OF THE INVENTION

1. Field of the Invention

The present invention relates to a polishing liquid, which is used in a process for the production of semiconductor integrated circuits, and a polishing method using the same. More specifically, the present invention relates to a polishing liquid, which can be preferably used for the gate formation of a semiconductor substrate, and a polishing method using the same. In particular, the present invention relates to a polishing liquid for polishing a semiconductor substrate having a layer containing polysilicon or a modified polysilicon by chemical mechanical polishing and a polishing method using the same.

2. Description of the Related Art

In recent years, in the development of semiconductor devices represented by a semiconductor integrated circuit (hereinafter, referred to as an "LSI" in some cases), high density and high integration through refining and lamination of wirings have been required in order to realize size reduction and high speed. As a technique for achieving the purpose, various techniques such as chemical mechanical polishing (hereinafter, referred to as "CMP" in some cases) have been used. The CMP is an essential technique in the case of carrying out surface planarization of a film to be processed such as an interlayer insulating film, formation of plugs, formation of embedded metal wirings, or the like, and is used for smoothening of a substrate or the like.

A general method of CMP is a method in which a polishing pad is adhered on a circular polishing platen (platen), the surface of the polishing pad is dipped in a polishing liquid, a surface (surface to be polished) of a substrate (e.g., wafer) is pressed against the pad, and both the polishing platen and the substrate are rotated in a state of being applied with a predetermined pressure (polishing pressure) from the rear face of the pad, to planarize the surface of the substrate by the mechanical friction generated.

Recently, CMP has been applied to the respective processes in the production of semiconductors, and in one embodiment thereof, for example, CMP is applied to a process for gate formation in the fabrication of transistors.

Herein, in conventional transistors, a gate mainly including a modified polysilicon obtained by introducing impurities such as B (boron) into polysilicon has been prepared. However, in transistors after 45 nm generations, the use of a gate insulating film having a high dielectric constant (a High-k film) and a metal gate electrode in place of the conventional polysilicon has been examined, in order to achieve both reduction in electric power consumption and high current driving ability. Some techniques to which these have been applied have been proposed. For example, a method has been proposed, in which a dummy insulating film and a dummy gate electrode are formed, a source-drain diffusion layer is formed by introducing impurities to a polycrystalline silicon film in a self-aligning manner, then the dummy insulating film and the dummy gate electrode are removed, and then a gate insulating layer having a high dielectric constant and a metal gate electrode are formed (see, for example, Japanese Patent Application Laid-Open (JP-A) Nos. 2006-339597, 2006-344836, and 2007-12922).

Further, some techniques concerning the method for forming a metal gate electrode have been proposed. As one example thereof for practical use, there is a fully silicided gate (hereinafter, may be referred to as a "FUSI gate"). The FUSI gate is formed by siliciding a gate electrode formed using polysilicon in a manner substantially similar to that in the conventional CMOS (Complementary Metal Oxide Semiconductor) process. Conventionally, only the upper portion of a gate electrode is silicided; however, in the FUSI gate, the entire gate electrode is silicided. As compared with the technique of forming a metal gate electrode by a Damascene process, FUSI is greatly advantageous in terms of process construction, since the knowhow of the conventional CMOS process is applicable.

In recent years, a method of selectively performing CMP with respect to the polysilicon or the like, and a second and/or third material at the periphery thereof, in the formation of a gate using such polysilicon or modified polysilicon (hereinafter, may be merely referred to as "polysilicon or the like") has been proposed (see, for example, JP-A No. 2005-93816). However, when a body to be polished which contains polysilicon or the like is polished by CMP using a conventionally known polishing liquid, there is a problem in that polysilicon or the like which is intended to remain as a gate material may be excessively polished. This problem may lead to cause other problems such as deterioration in performance of LSI to be obtained or the like.

SUMMARY OF THE INVENTION

An object of the present invention is to provide a polishing liquid which can be used for chemical mechanical polishing of a body to be polished in fabrication of a semiconductor integrated circuit, the body to be polished having at least a first layer containing polysilicon or a modified polysilicon, and a second layer containing at least one selected from the group consisting of silicon oxide, silicon nitride, silicon carbide, silicon carbonitride, silicon oxycarbide, and silicon oxynitride, wherein, using the polishing liquid, a layer containing a silicon-based material other than polysilicon or a modified polysilicon is polished at a higher polishing rate and polishing of the layer containing polysilicon or a modified polysilicon can selectively be suppressed; and a polishing method using the polishing liquid.

Hereinbelow, aspects of the present invention will be described.

<1> A polishing liquid which is used for chemical mechanical polishing of a body to be polished in a planarization process for fabrication of a semiconductor integrated circuit, in which the body to be polished comprises at least a first layer including polysilicon or a modified polysilicon, and a second layer comprising at least one selected from the group consisting of silicon oxide, silicon nitride, silicon carbide, silicon carbonitride, silicon oxycarbide, and silicon oxynitride, wherein the polishing liquid comprises the following components (A), (B), and (C), has a pH of from 1.5 to 7.0, and selectively polishes the second layer with respect to the first layer:

(A) colloidal silica particles having a negative $\zeta$ potential;

(B) phosphoric acid or an organic phosphonic acid compound represented by the following Formula (1) or Formula (2):

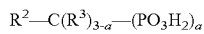   Formula (1):

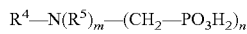   Formula (2):

wherein, in Formula (1), a represents 1 or 2; $R^2$ and $R^3$ each independently represent a hydrogen atom, a hydroxyl group, a carboxyl group, a phenyl group, or a substituted or unsubstituted alkyl group having 1 to 6 carbon atoms; and a substituent for the substituted alkyl group being a hydroxyl group, an amino group, a carboxyl group, a hydroxyamino group, a phosphonic acid group, or a phenyl group; and in Formula (2), $R^4$ represents a substituted or unsubstituted alkyl group having 1 to 6 carbon atoms, —(CH$_2$—PO$_3$H$_2$), or -A-N(R$^5$)$_p$—(CH$_2$—PO$_3$H$_2$)$_q$; A represents a single bond or an alkylene group having 1 to 4 carbon atoms; $R^5$ represents a substituted or unsubstituted alkyl group having 1 to 6 carbon atoms or —(CH$_2$—PO$_3$H$_2$); m represents 0 or 1, n represents 1 or 2, and m+n=2; and p represents 0 or 1, q represents 1 or 2, and p+q=2; and (C) an anionic surfactant having at least one group represented by the following Formula (I), Formula (II), Formula (III), or Formula (IV):

   Formula (I):

   Formula (II):

   Formula (III):

   Formula (IV):

wherein, in Formulae (I) to (IV), each X independently represents a hydrogen atom, lithium, sodium, potassium, or a quaternary ammonium cation.

<2> The polishing liquid according to <1>, which enables polishing the body to be polished at a ratio represented by RR(other)/RR(p-Si) in a range of from 1.5 to 200, wherein RR(p-Si) indicates a polishing rate of the first layer and RR(other) indicates a polishing rate of the second layer.

<3> The polishing liquid according to <1> or <2>, wherein the concentration of the colloidal silica particles is in a range of from 0.1% by mass to 10% by mass with respect to the total mass of the polishing liquid.

<4> The polishing liquid according to any one of <1> to <3>, wherein the colloidal silica particles have an average primary particle diameter of from 5 nm to 100 nm and an average secondary particle diameter of from 10 nm to 300 nm.

<5> The polishing liquid according to any one of <1> to <4>, wherein the ζ potential of the (A) colloidal silica particles is in a range of −50 mV to −5 mV.

<6> The polishing liquid according to any one of <1> to <5>, wherein the (B) organic phosphonic acid compound comprises at least one compound selected from the group consisting of the following B10, B13, and B15:

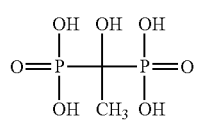
B10

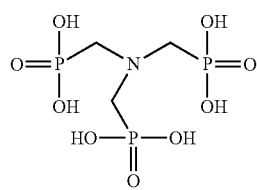
B13

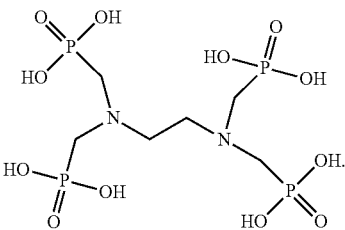
B15

<7> The polishing liquid according to any one of <1> to <6>, wherein the concentration of the (C) anionic surfactant is in a range of from 0.001% by mass to 1% by mass with respect to the total mass of the polishing liquid.

<8> The polishing liquid according to any one of <1> to <7>, wherein the (C) anionic surfactant comprises a compound having two or more groups independently selected from the group consisting of groups represented by Formula (I) to Formula (IV).

<9> A chemical mechanical polishing method for polishing a body to be polished having at least a first layer comprising polysilicon or a modified polysilicon, and a second layer comprising at least one selected from the group consisting of silicon oxide, silicon nitride, silicon carbide, silicon carbonitride, silicon oxycarbide, and silicon oxynitride, wherein the polishing method comprises:

(a) bringing a surface of the body to be polished into contact with a polishing pad and a polishing liquid, and (b) moving the polishing pad and the body to be polished relatively to each other, while bringing a portion of the polishing liquid into contact with the surface of the body to be polished between the polishing pad and the body to be polished, for a period sufficient for carrying out polishing of the second layer, wherein the polishing liquid comprises the following components (A), (B), and (C) and has a pH of from 1.5 to 7.0:

(A) colloidal silica particles having a negative potential;

(B) phosphoric acid or an organic phosphonic acid compound represented by the following Formula (1) or Formula (2):

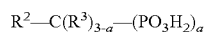   Formula (1):

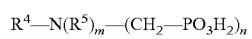   Formula (2):

wherein, in Formula (1), a represents 1 or 2; $R^2$ and $R^3$ each independently represent a hydrogen atom, a hydroxyl group, or a substituted or unsubstituted alkyl group having 1 to 6 carbon atoms; and a substituent for the substituted alkyl group is a hydroxyl group, an amino group, a carboxyl group, a hydroxyamino group, a phosphonic acid group, or a phenyl group; and in Formula (2), $R^4$ represents a substituted or unsubstituted alkyl group having 1 to 6 carbon atoms, —(CH$_2$—PO$_3$H$_2$), or -A-N(R$^5$)$_p$—(CH$_2$—PO$_3$H$_2$)$_q$; A represents a single bond or an alkylene group having 1 to 4 carbon atoms; $R^5$ represents a substituted or unsubstituted alkyl group having 1 to 6 carbon atoms or —(CH$_2$—PO$_3$H$_2$); m represents 0 or 1, n represents 1 or 2, and m+n=2; and p represents 0 or 1, q represents 1 or 2, and p+q=2; and (C) an anionic surfactant having at least one group represented by the following Formula (I), Formula (II), Formula (III), or Formula (IV):

   Formula (I):

   Formula (II):

—COOX                                    Formula (III):

—SO$_3$X                                 Formula (IV):

wherein, in Formulae (I) to (IV), each X independently represents a hydrogen atom, lithium, sodium, potassium, or a quaternary ammonium cation.

<10> The polishing method according to <9>, with which the body to be polished is polished at a ratio represented by RR(other)/RR(p-Si) in a range of from 1.5 to 200, wherein RR(p-Si) indicates a polishing rate of the first layer and RR(other) indicates a polishing rate of the second layer.

<11> The polishing method according to <9> or <10>, wherein the concentration of the colloidal silica particles is in a range of from 0.1% by mass to 10% by mass with respect to the total mass of the polishing liquid.

<12> The polishing method according to any one of <9> to <11>, wherein the colloidal silica particles have an average primary particle diameter of from 5 nm to 100 nm and an average secondary particle diameter of from 10 nm to 300 nm.

<13> The polishing method according to any one of <9> to <12>, wherein the ζ potential of the colloidal silica particles is in a range of from −50 mV to −5 mV.

<14> The polishing method according to any one of <9> to <13>, wherein the organic phosphonic acid compound comprises at least one compound independently selected from the group consisting of the following B10, B13, and B15:

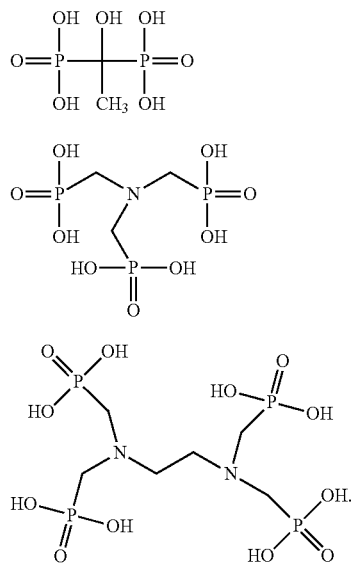

<15> The polishing method according to any one of <9> to <14>, wherein the concentration of the anionic surfactant is in a range of from 0.001% by mass to 1% by mass with respect to the total mass of the polishing liquid.

<16> The polishing method according to any one of <9> to <15>, wherein the (C) anionic surfactant comprises a compound having two or more groups independently selected from the group consisting of groups represented by Formula (I) to Formula (IV).

According to the present invention, a polishing liquid which can be used for chemical mechanical polishing of a body to be polished in fabrication of a semiconductor integrated circuit, the body to be polished having at least a first layer containing polysilicon or a modified polysilicon, and a second layer containing at least one selected from the group consisting of silicon oxide, silicon nitride, silicon carbide, silicon carbonitride, silicon oxycarbide, and silicon oxynitride, wherein, using the polishing liquid, polishing of a layer containing a silicon-based material other than polysilicon or a modified polysilicon is performed at a high polishing rate and polishing of the layer containing polysilicon or a modified polysilicon can selectively be suppressed; and a polishing method using the polishing liquid may be provided.

DETAILED DESCRIPTION OF THE INVENTION

Hereinafter, the polishing liquid and the polishing method using the same according to the present invention are described in detail.

Polishing Liquid

The polishing liquid of the present invention is used for chemical mechanical polishing of a body to be polished in a planarization process for fabrication of a semiconductor integrated circuit, in which the body to be polished has at least: a first layer containing polysilicon or a modified polysilicon; and a second layer containing at least one selected from the group consisting of silicon oxide, silicon nitride, silicon carbide, silicon carbonitride, silicon oxycarbide, and silicon oxynitride. The polishing liquid includes at least the following components (A), (B), and (C), has a pH of from 1.5 to 7.0, and is capable of selectively polishing the second layer with respect to the first layer:

(A) colloidal silica particles having a negative ζ potential;

(B) phosphoric acid or an organic phosphonic acid compound represented by the following Formula (1) or Formula (2); and (C) an anionic surfactant having at least one group represented by the following Formula (I), Formula (II), Formula (III), or Formula (IV):

(B)

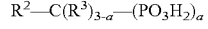    Formula (1):

R$^2$—C(R$^3$)$_{3-a}$—(PO$_3$H$_2$)$_a$

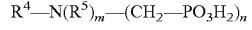    Formula (2):

R$^4$—N(R$^5$)$_m$—(CH$_2$—PO$_3$H$_2$)$_n$

In Formula (1), a represents 1 or 2; R$^2$ and R$^3$ each independently represent a hydrogen atom, a hydroxyl group, a carboxyl group, a phenyl group, or a substituted or unsubstituted alkyl group having 1 to 6 carbon atoms. When the alkyl group has a substituent, the substituent is a hydroxyl group, an amino group, a carboxyl group, or a phenyl group. Plural R$^3$'s may be the same as or different from each other, and a preferably represents 2.

In Formula (2), R$^4$ represents a substituted or unsubstituted alkyl group having 1 to 6 carbon atoms, —(CH$_2$—PO$_3$H$_2$), or -A-N(R$^5$)$_p$—(CH$_2$—PO$_3$H$_2$)$_q$, in which A represents a single bond or an alkylene group having 1 to 4 carbon atoms; and R$^5$ represents a substituted or unsubstituted alkyl group having 1 to 6 carbon atoms or —(CH$_2$—PO$_3$H$_2$). In Formula (2), m represents 0 or 1; n represents 1 or 2; and m+n=2. In the -A-N(R$^5$)$_p$—(CH$_2$—PO$_3$H$_2$)$_q$ group which may be represented by R$^4$, p represents 0 or 1, q represents 1 or 2, and p+q=2.

(C)

—PO$_3$X$_2$                              Formula (I):

—OPO$_3$X$_2$                            Formula (II):

—COOX                                    Formula (III):

—SO$_3$X                                 Formula (IV):

In Formulae (I) to (IV), each X independently represents a hydrogen atom, lithium, sodium, potassium, or a quaternary ammonium cation.

In the present invention, the term "polishing liquid" encompasses not only a polishing liquid that is used when polishing (namely, a polishing liquid that has been diluted as needs arise), but also a concentrated liquid of a polishing liquid. The concentrated liquid or the concentrated polishing liquid refers to a polishing liquid in which the concentration of the solute has been adjusted to be higher than that in the polishing liquid used when polishing, and the concentrated liquid or the concentrated polishing liquid is diluted with water or an aqueous solution, when used for polishing. The rate of dilution is generally from 1 to 20 times by volume. In this specification, the terms "concentration" and "a concentrated liquid" are used in accordance with idiomatic expressions referring to as "a higher concentration" or "a liquid having a higher concentration" than the concentration in the usage state, and are used in a different way of usage from the general meanings which includes a physical concentration operation such as evaporation or the like.

The polishing liquid of the present invention is preferably used when polysilicon or a modified polysilicon is used as an electrode material, and formation of a gate electrode in a semiconductor integrated circuit is carried out through CMP. More specifically, the polishing liquid of the present invention is a polishing liquid used for chemical mechanical polishing of a body to be polished in a planarization process for fabrication of a semiconductor integrated circuit, in which the body to be polished has at least a first layer containing polysilicon or a modified polysilicon, and a second layer containing at least one selected from the group consisting of silicon oxide, silicon nitride, silicon carbide, silicon carbonitride, silicon oxycarbide, and silicon oxynitride.

The polishing liquid of the present invention is characterized in that it includes the components (A), (B), and (C) described above and has a pH of from 1.5 to 7.0. By having such a configuration, the second layer containing at least one selected from the group consisting of silicon oxide, silicon nitride, silicon carbide, silicon carbonitride, silicon oxycarbide, and silicon oxynitride may be selectively polished with respect to the first layer containing polysilicon or a modified polysilicon.

Regarding the selective polishing of the second layer with respect to the first layer, the polishing liquid of the present invention is preferably a polishing liquid that is capable of polishing the body to be polished at a ratio represented by RR(other)/RR(p-Si) of from 1.5 to 200, wherein RR(p-Si) indicates a polishing rate of the first layer and RR(other) indicates a polishing rate of the second layer. The ratio represented by RR(other)/RR(p-Si) is more preferably in a range of from 3 to 100. When the ratio represented by RR(other)/RR(p-Si) is within such ranges, undesired polishing of the first layer is suppressed and also, uneven peeling of the first layer which may be caused due to an excessive stress to be applied to the film interface between the first layer and an underlayer thereof at the time of polishing is effectively suppressed.

Accordingly, by using the polishing liquid of the present invention, in the fabrication of LSI, even when a gate electrode including polysilicon or a modified polysilicon is formed by CMP, the gate electrode is never excessively polished, but in contrast, a layer containing a silicon-based material other than polysilicon (or a modified polysilicon, which required to be rapidly polished, is rapidly polished.

Hereinafter, each component of the polishing liquid of the present invention is explained in detail.

(A) Colloidal Silica Particles Having Negative $\zeta$ Potential

The polishing liquid of the present invention includes, as at least one part of abrasive grains, (A) colloidal silica particles whose surface exhibits a negative $\zeta$ potential. The colloidal silica is not particularly limited as long as the surface thereof exhibits a negative $\zeta$ potential, and is preferably colloidal silica whose surface exhibits a negative $\zeta$ potential as a result of adsorption of an anionic compound onto the surface of colloidal silica having a positive charge. Namely, colloidal silica whose surface exhibits a negative $\zeta$ potential, which is prepared by blending colloidal silica having a positive charge and an anionic compound, in the polishing liquid system, so that the anionic compound adsorbs onto the surface of the colloidal silica, is preferable.

Such colloidal silica whose surface is to be modified or reformed is preferably colloidal silica which does not contain impurities, such as alkali metal, inside the particle, and is obtained by hydrolysis of alkoxysilane. On the other hand, colloidal silica manufactured by a method of removing alkali from an aqueous alkali silicate solution can be also used, however in this case, there is a concern that the alkali metal remaining inside the particles may gradually elute, to exert adverse influence on the polishing performance. From this point of view, colloidal silica obtained by hydrolysis of alkoxysilane is more preferable as a raw material.

Anionic Compound

First, colloidal silica in which an anionic compound is adsorbed onto a surface thereof, which is one embodiment of colloidal silica whose surface exhibits a negative $\zeta$ potential, is explained.

The anionic compound used herein may be any compound as long as the compound is a generally used anionic compound, and may be either an inorganic anionic compound or an organic anionic compound. However, the anionic surfactants described below are not included in the scope of the anionic compound.

The concentration of the anionic compound in the polishing liquid of the invention is preferably from 0.00005% by mass to 1% by mass with respect to the total mass of the polishing liquid, from the viewpoint of controlling the polishing rate by making the surface of the colloidal silica exhibit a negative $\zeta$ potential. The concentration of the anionic compound is more preferably from 0.0001% by mass to 1% by mass, and particularly preferably from 0.001% by mass to 1% by mass.

The fact that the colloidal silica particles whose surfaces exhibit a negative $\zeta$ potential can be prepared by allowing an anionic compound to act on colloidal silica having a positive charge may be confirmed in a manner described below.

Specifically, when a polishing liquid B is obtained by adding the anionic compound to a polishing liquid A containing an oxidizing agent and a corrosion inhibitor, the ratio of the polishing rate in the case of using the polishing liquid B relative to the polishing rate in the case of using the polishing liquid A, which is the polishing liquid before adding the anionic compound, is determined. When the polishing rate in the case of using the polishing liquid B becomes 80% or lower of the polishing rate in the case of using the polishing liquid A, it is confirmed that the colloidal silica particles whose surfaces exhibit a negative $\zeta$ potential have been formed. It is preferable that the polishing rate in the case of using the polishing liquid B becomes 50% or lower of the polishing rate in the case of using the polishing liquid A.

By the above method, it can be confirmed that colloidal silica particles whose surfaces exhibit a negative $\zeta$ potential have been formed, and that the polishing selectivity is improved due to the colloidal silica particles whose surfaces exhibit a negative ζ potential.

In order to allow the anionic compound to adsorb onto the surface of colloidal silica, it is enough to only mix the above compound and the colloidal silica.

Thereby, the anionic compound having a structure as described above adsorbs onto the surface of colloidal silica having a little negative charge, and as a result, colloidal silica whose surface exhibits a negative ζ potential may be obtained.

Here, in the present invention, the ζ potential of the surface of colloidal silica may be measured by, for example, an electrophoresis method or an ultrasonic vibration method. As a specific measuring instrument, DT-1200 (trade name, manufactured by Nihon Rufuto Co., Ltd.) or the like may be used.

The particle diameter of the colloidal silica particles that serve as a raw material may be selected as appropriate according to the purpose of use. The average primary particle diameter of the colloidal silica particles is preferably in a range of from 5 nm to 100 nm, more preferably in a range of from 10 nm to 100 nm, and even more preferably in a range of from 10 nm to 80 nm. The average secondary particle diameter of the colloidal silica particles is preferably in a range of from 10 nm to 300 nm, more preferably in a range of from 20 nm to 300 nm, and even more preferably in a range of from 20 nm to 200 nm.

The colloidal silica particles in the invention particularly preferably have an average primary particle diameter of from 5 nm to 100 nm and an average secondary particle diameter of from 10 nm to 300 nm.

When the particle diameter of the colloidal silica particles satisfies the above ranges, the occurrence of scratches caused by polishing may be effectively suppressed.

Here, the average primary particle diameter of the colloidal silica particles in the present invention means the particle diameter at a point where the cumulative frequency is 50% in a particle size accumulation curve obtained in terms of volume.

The average primary particle diameter of the colloidal silica particles may be measured using an electron microscope (emission type electron microscope) or the like.

Further, the average particle diameter (average secondary particle diameter) of the secondary particles which are formed by partial aggregation of the colloidal silica particles refers to an average particle diameter determined in the particle size distribution obtained by a dynamic light scattering method. As a measuring apparatus for determination of the particle size distribution, for example, LB-500 (trade name) manufactured by Horiba Ltd. or the like is used.

The content of the (A) colloidal silica whose surface exhibits a negative ζ potential in the polishing liquid of the invention is preferably from 0.5% by mass to 10% by mass, more preferably from 0.5% by mass to 8% by mass, and particularly preferably from 1% by mass to 7% by mass, with respect to the total mass of the polishing liquid (hereinafter, the term "polishing liquid" refers to the polishing liquid used when polishing, that is, in the case of diluting with water or an aqueous solution, the term "polishing liquid" refers to the polishing liquid after dilution. The term "polishing liquid used when polishing" in the description below also has the same meaning). Specifically, the content of the colloidal silica is preferably 0.5% by mass or higher from the viewpoint of polishing the second layer at a sufficient polishing rate, but is preferably 10% by mass or lower from the viewpoint of storage stability.

In the polishing liquid of the present invention, abrasive grains other than the colloidal silica whose surface exhibits a negative ζ potential may be used in combination with the colloidal silica as long as the effects of the invention are not impaired. However, even in such a case, the content proportion of the colloidal silica whose surface exhibits a negative ζ potential relative to all the abrasive grains to be included in the polishing liquid is preferably 50% by mass or higher, and particularly preferably 80% by mass or higher. All of the abrasive grains contained in the polishing liquid may be the colloidal silica whose surface exhibits a negative ζ potential.

Examples of the abrasive grains which may be used in combination with the colloidal silica whose surface exhibits a negative ζ potential in the polishing liquid of the invention include fumed silica, ceria, alumina, and titania. It is preferable that the size of the abrasive grains which may be used in combination with the colloidal silica is equal to or larger than the size of the colloidal silica whose surface exhibits a negative ζ potential, but not more than twice the size of the colloidal silica whose surface exhibits a negative ζ potential.

(B) Phosphoric Acid or Organic Phosphonic Acid Compound Represented by Formula (1) or Formula (2)

The polishing liquid of the present invention further contains (B) phosphoric acid or an organic phosphonic acid compound represented by Formula (1) or Formula (2) (hereinafter, the phosphoric acid and the organic phosphonic acid compound represented by Formula (1) or Formula (2) may correctively be referred to as "phosphonic acid B", appropriately). However, the anionic surfactants including the group represented by Formula (I) described below are not included in the phosphonic acid B, and the structure of the phosphonic acid B is different from the structure of the anionic surfactants including the group represented by Formula (I) described below.

The phosphonic acid B is not a metal oxidizing agent, and has a function as an oxidization accelerator, a pH adjusting agent, or a buffer. Particularly, in the present invention, the phosphonic acid B has a function as an accelerator for silicon nitride.

It should be noted that whether the phosphonic acid B has a function as an accelerator for silicon nitride or not can be confirmed by the following means.

In a case in which, due to the addition of the compound, the polishing rate of silicon nitride when the compound is added (RRa) and the polishing rate of silicon nitride when the compound is not added (RRb) have a relationship of (RRa)> (RRb), it is defined that the compound has a function as an accelerator for silicon nitride. Whether the compound has a function as an accelerator for silicon nitride or not is judged from the results whether (RRa) and (RRb) satisfy the relationship or not.

From the viewpoint of achieving a sufficient polishing rate ratio, the phosphonic acid B according to the present invention is phosphoric acid or a compound having a structure represented by the following Formula (1) or Formula (2).

$$R^2-C(R^3)_{3-a}-(PO_3H_2)_a \qquad \text{Formula (1):}$$

$$R^4-N(R^5)_m-(CH_2-PO_3H_2)_n \qquad \text{Formula (2):}$$

In Formula (1), a represents 1 or 2; $R^2$ and $R^3$ each independently represent a hydrogen atom, a hydroxyl group, a carboxyl group, a phenyl group, or a substituted or unsubstituted alkyl group having 1 to 6 carbon atoms; plural $R^3$'s may be the same as or different from each other. In Formula (1), a more preferably represents 2.

In Formula (2), $R^4$ represents a substituted or unsubstituted alkyl group having 1 to 6 carbon atoms, $-(CH_2-PO_3H_2)$, or -A-N($R^5$)$_p$—(CH$_2$—PO$_3$H$_2$)$_q$; A represents a single bond or an alkylene group having 1 to 4 carbon atoms; and $R^5$ represents a substituted or unsubstituted alkyl group having 1 to 6 carbon atoms or —(CH$_2$—PO$_3$H$_2$). In Formula (2), m represents 0 or 1; n represents 1 or 2, and m+n=2. In the -A-N($R^5$)$_p$—(CH$_2$—PO$_3$H$_2$)$_q$ group which may be represented by $R^4$, p represents 0 or 1; q represents 1 or 2; and p+q=2.

In Formulae (1) and (2), specific examples of the substituted or unsubstituted alkyl group having 1 to 6 carbon atoms represented by any one of $R^2$ to $R^5$ include a methyl group, an ethyl group, a propyl group, a butyl group, a pentyl group, and a hexyl group. Among them, a methyl group, an ethyl group, a propyl group, a butyl group, and a pentyl group are preferable.

In addition, a cycloalkyl group is also preferable. Specific examples thereof include a cyclohexyl group and a cyclopentyl group. Of these groups, a cyclohexyl group is preferable.

Examples of the substituent of the substituted alkyl group include an amino group, a hydroxyamino group, a carboxyl group, and phosphonic acid group.

Hereinafter, specific examples of the phsphonic acid B according to the invention are shown. However, the present invention is not at all limited to these specific examples.

Among the following exemplary compounds, B10, B13, and B15 are particularly preferable.

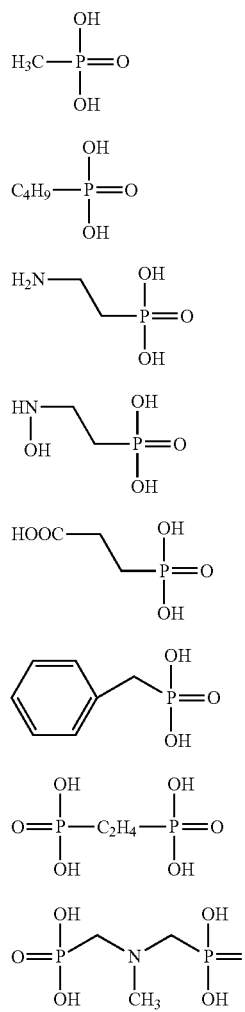

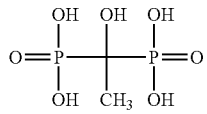

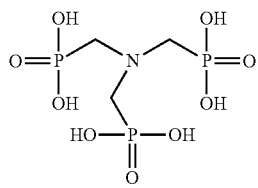

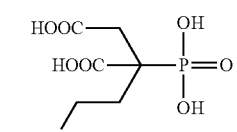

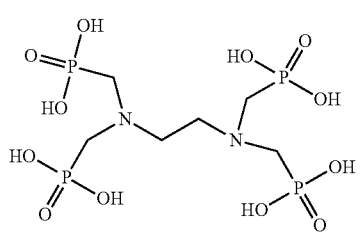

One kind of phosphonic acids B may be incorporated in the polishing liquid, or a combination of two or more kinds of them may be used.

The content of the phosphonic acid B in the polishing liquid is preferably from 0.001% by mass to 5% by mass, more preferably from 0.005% by mass to 5% by mass, and even more preferably from 0.05% by mass to 5% by mass, with respect to the mass of the polishing liquid used when polishing. Specifically, the content of the phosphonic acid B is preferably 0.001% by mass or higher from the viewpoint of achieving a sufficient polishing rate, but is preferably 5% by mass or lower from the viewpoint of maintaining satisfactory flatness.

Organic Acid

The polishing liquid of the present invention may further contain an additional organic acid that is generally used, as long as the effect of the invention is not impaired.

The additional organic acid is preferably water-soluble, and examples thereof include water-soluble organic acids and amino acids. As examples of the water-soluble organic acids or amino acids, for example, those selected from the following group are more suitable.

Specifically, examples of the organic acids include formic acid, acetic acid, propionic acid, butyric acid, valerianic acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyl iminodiacetic acid, imonodiacetic acid, acetamido iminodiacetic acid, nitrilotripropanoic acid, nitrilotrimethylphosphonic acid, dihydroxyethyl glycine, tricine and ammonium salts or alkali metal salts thereof, and mixtures thereof.

Examples of the amino acids include glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lycine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lycine, creatine, L-kynurenine, L-histidine, 1-methyl-L-histidine, 3-methyl-L-histidine, ergothioneine, L-tryptophan, actinomycin C1, apamin, angiotensin I, angiotensin II, and antipain.

Moreover, specific examples of the organic acid which may be used in combination include nitrilotriacetic acid, diethylenetriaminepentaacetic acid, ethylenediaminetetraacetic acid, oxalic acid, malonic acid, succinic acid, glutaric acid, adipic acid, pimelic acid, maleic acid, phthalic acid, malic acid, tartaric acid, citric acid, diglycolic acid, 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, phenoxyacetic acid, and mixtures thereof. Among them, from the viewpoint of achieving a good selection ratio, ethylenediaminetetraacetic acid, oxalic acid, malonic acid, succinic acid, glutaric acid, adipic acid, pimelic acid, maleic acid, phthalic acid, malic acid, tartaric acid, citric acid, and diglycolic acid are preferable, and oxalic acid, adipic acid, pimelic acid, maleic acid, malic acid, tartaric acid, citric acid, and diglycolic acid are more preferable.

When the additional organic acid is used in combination with the (B) organic phosphonic acid, the total content of organic acids (including the (B) organic phosphonic acid and the additional organic acid) is preferably from 0.01% by mass to 10% by mass, more preferably from 0.1% by mass to 10% by mass, and even more preferably from 0.5% by mass to 5% by mass, with respect to the mass of the polishing liquid used when polishing.

(C) Anionic Surfactant Having at Least One Group Represented by Formula (I), Formula (II), Formula (III), or Formula (IV)

The polishing liquid of the present invention further contains (C) an anionic surfactant having at least one group represented by Formula (I), Formula (II), Formula (III), or Formula (IV).

It is enough that the anionic surfactant is an anionic surfactant having at least one group represented by any of the following Formula (I), Formula (II), Formula (III), or Formula (IV).

—PO$_3$X$_2$  Formula (I):

—OPO$_3$X$_2$  Formula (II):

—COOX  Formula (III):

—SO$_3$X  Formula (IV):

In Formulae (I) to (IV), each X independently represents a hydrogen atom, lithium, sodium, potassium, or a quaternary ammonium cation.

Particularly, a compound having one or more groups independently represented by Formula (I) to (IV) in the molecule is preferable, and further, a compound having two or more groups independently represented by Formula (I) to (IV) in the molecule is preferable.

The compound having one or more groups independently represented by Formula (I) to (IV) in the molecule may be a compound represented by $R^1$—PO$_3$X$_2$, $R^1$—OPO$_3$X$_2$, $R^1$—COOX, or $R^1$—SO$_3$X. Herein, $R^1$ represents an alkyl group having 6 to 30 carbon atoms, an alkenyl group having 6 to 30 carbon atoms, a cycloalkyl group having 6 to 30 carbon atoms, an aryl group having 6 to 30 carbon atoms, or an aralkyl group having 6 to 30 carbon atoms, each of which may further have a substituent, examples of which including an alkyl group having 8 to 12 carbon atoms and —SO$_3$H. X in the above compounds represents a hydrogen atom, lithium, sodium, potassium, or a quaternary ammonium cation.

The compound represented by $R^1$—PO$_3$X$_2$ is particularly preferable. Alternatively, a compound having a group represented by Formula (II) and a group represented by Formula (IV) in a molecule thereof is particularly preferable.

Preferable specific examples are shown below. However, the present invention is not limited to these compounds.

In the present invention, the following compound P9 is preferably used as the (C) anionic surfactant.

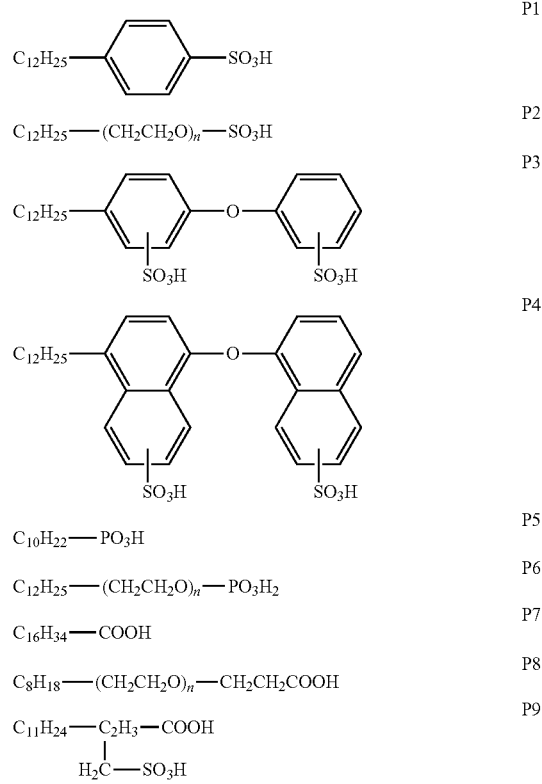

One kind of (C) anionic surfactants may be used alone, or a combination of two or more kinds of (C) anionic surfactants may be used.

The content of the (C) anionic surfactant is preferably from 0.001% by mass to 1% by mass, more preferably from 0.01% by mass to 1% by mass, and even more preferably from 0.1% by mass to 1% by mass, with respect to the mass of the polishing liquid used when polishing. When the content is within the ranges, the suppression effect on the polishing rate of polysilicon may become satisfactory.

Other Components

Arbitrary components other than the essential components described above may further be added, as necessary, to the polishing liquid of the invention. Hereinafter, the other components which may arbitrarily be used are described in detail.

Corrosion Inhibitor

The polishing liquid of the present invention may further contain a corrosion inhibitor that adsorbs onto the surface to be polished and forms a film to thereby suppress the corrosion of a metal surface. It is preferable that the corrosion inhibitor used in the present invention contains a heteroaromatic ring compound having 3 or more nitrogen atoms and also having a condensed ring structure in the molecule. Here, the "3 or more nitrogen atoms" are preferably nitrogen atoms that are constituents of the condensed ring. Preferable examples of such a heteroaromatic ring compound include benzotriazole and derivatives obtained by introducing various kinds of substituents into benzotriazole.

Examples of the corrosion inhibitor, which may be used in the present invention, include benzotriazole (hereinafter, also referred to as "BTA"), 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole. Above all, it is more preferable that the corrosion inhibitor is selected from the group consisting of 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole.

The amount of corrosion inhibitor to be added is preferably from 0.01% by mass to 0.2% by mass, and more preferably from 0.05% by mass to 0.2% by mass, with respect to the mass of the polishing liquid used when polishing. Specifically, the addition amount of such a corrosion inhibitor is preferably 0.01% by mass or more from the viewpoint of not enlarging dishing, but is preferably 0.2% mass or less from the viewpoint of storage stability.

Oxidizing Agent

The polishing liquid of the present invention may further contain a compound (oxidizing agent) that oxidizes a metal which is a polishing object.

Examples of the oxidizing agent include hydrogen peroxide, peroxides, nitrates, iodates, periodates, hypochlorites, chlorites, chlorates, perchlorates, peroxosulfates, dichromates, permanganates, ozone water, silver(II) salts, and iron(III) salts. Among them, hydrogen peroxide is preferably used.

It should be noted that, as the iron(III) salts, for example, an organic complex salt of iron(III) is preferably used, besides inorganic iron(III) salts such as iron(III) nitrate, iron(III) chloride, iron(III) sulfate, or iron(III) bromide.

pH Adjusting Agent

The polishing liquid of the present invention should have a pH of from 1.5 to 7.0. It is preferable that the pH of the polishing liquid of the invention is in a range of from 2.5 to 7. When the pH is within the ranges, the polishing liquid of the invention exerts excellent effects.

In order to adjust the pH of the polishing liquid to fall within the above ranges, an alkali/acid or a buffer is used.

Preferable examples of the alkali/acid or the buffer may include non-metal alkali agents such as ammonia, ammonium hydroxide, organic ammonia hydroxides such as tetramethylammonium hydroxide, or alkanol amines such as diethanolamine, triethanolamine, or triisopropanolamine; alkali metal hydroxides such as sodium hydroxide, potassium hydroxide, or lithium hydroxide; inorganic acids such as nitric acid, sulfuric acid, or phosphoric acid; carbonates such as sodium carbonate; phosphates such as trisodium phosphate; borates; tetraborates; and hydroxybenzoates. As the alkali agent, ammonium hydroxide, potassium hydroxide, lithium hydroxide, and tetramethylammonium hydroxide are particularly preferable.

The amount of the alkali/acid or the buffer to be added may be any amount as long as the pH is maintained in the preferable range. The amount to be added is preferably from 0.0001 mol to 1.0 mol, and more preferably from 0.003 mol to 0.5 mol, per 1 L of the polishing liquid used when polishing.

Chelating Agent

It is preferable that the polishing liquid of the present invention optionally contains a chelating agent (namely, a water softener) in order to reduce the adverse influence of polyvalent metal ions which may be present as a contaminant, or the like.

Examples of the chelating agent include general purpose water softeners, which are a precipitation inhibitor of calcium or magnesium, and analogous compounds thereof. Specific examples thereof include nitrilotriacetic acid, diethylenetriaminepentaacetic acid, ethylenediaminetetraacetic acid, N,N,N-aminotrimethylenephosphonic acid, ethylenediamine-N,N,N',N'-tetramethylenesulfonic acid, trans-cyclohexanediaminetetraacetic acid, 1,2-diaminopropanetetraacetic acid, glycol ether diaminetetraacetic acid, ethylenediamine ortho-hydroxyphenylacetic acid, ethylenediamine disuccinic acid (SS form), N-(2-carboxylatoethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, and 1,2-hydroxybenzene-4,6-disulfonic acid.

A combination of two or more kinds of chelating agents may be used, as necessary.

The amount of the chelating agent to be added may be any amount as long as the amount is sufficient to seal the metal ions such as polyvalent metal ions that may be present as a contaminant or the like. For example, the chelating agent is added in an amount of from 0.0003 mol to 0.07 mol, per 1 L of the polishing liquid used when polishing.

Polishing Object

The polishing object to which the polishing liquid of the invention is applied is a body to be polished which is configured to include at least a first layer containing polysilicon or a modified polysilicon, and a second layer containing at least one selected from the group consisting of silicon oxide, silicon nitride, silicon carbide, silicon carbonitride, silicon oxycarbide, and silicon oxynitride. More specifically, the polishing liquid of the invention is preferably used for formation of a gate electrode in a semiconductor integrated circuit by CMP when polysilicon or a modified polysilicon is used as an electrode material.

Note that, the "modified polysilicon" includes silicon in which impurity elements such as B (boron) or P (phosphorus) have been doped in polysilicon.

In general, a gate electrode is formed by the following method. Namely, first, a layer formed from silicon oxide or the like is formed on a surface of a substrate, then a concave portion is formed at the layer by etching or the like, and then the formed concave portion is filled with polysilicon or a modified polysilicon, thereby forming a first layer. Next, on the surface thus prepared, a second layer containing at least one selected from the group consisting of silicon oxide, silicon nitride, silicon carbide, silicon carbonitride, silicon oxycarbide, and silicon oxynitride is laminated as a barrier layer.

In CMP for the formation of the gate electrode, the polishing starts from the surface of the second layer, and when polishing of the second layer is advanced to expose the surface of the first layer, the polishing rate is rapidly decreased, and as a result, the completion of the polishing of the second layer is detected. Thus, excessive polishing of the polysilicon surface or modified polysilicon surface used for the gate electrode is suppressed. The modified polysilicon refers to a polysilicon in which impurities such as B or P have been doped in polysilicon.

Thereafter, portions other than the polysilicon or modified polysilicon which functions as an electrode and the needed silicon oxide layer of the periphery thereof are removed by etching, whereby the gate electrode is formed.

Polishing Method

In the polishing method of the present invention, the polishing liquid of the present invention is used, and the polishing liquid is supplied to a polishing pad on a polishing platen, the polishing platen is rotated, thereby allowing the polishing pad and the body to be polished to move relatively to each other while bringing the polishing pad into contact with the surface to be polished of the body to be polished for carrying out polishing.

The polishing liquid of the present invention may be any of: (Case 1.) a concentrated liquid, which is diluted with water or an aqueous solution before use, to prepare a liquid to be used; (Case 2.) a liquid prepared by mixing the respective components in the form of an aqueous solution as described in the following section and, as necessary, diluting by addition of water to prepare a liquid to be used; or (Case 3.) a liquid which can be used as it is for polishing. The polishing liquid of any of the above cases can be applied to the polishing method of the present invention.

As an apparatus used for polishing, a general polishing apparatus provided with a holder that holds a body to be polished having a surface to be polished (for example, a wafer on which an electrically conductive material film is formed, or the like) and a polishing platen (which is equipped with a motor in which the number of rotations can be changed, or the like) to which a polishing pad is adhered may be used. The polishing pad is not particularly limited, and a common nonwoven fabric, polyurethane foam, porous fluororesin, or the like may be used as the polishing pad. Further, there is no limitation as to the polishing conditions, but the rotation rate of the polishing platen is preferably as low as 200 rpm or lower so that the body to be polished does not leap out. The pressure for pressing the body to be polished having the surface to be polished (film to be polished) against the polishing pad is preferably from 0.68 kPa to 34.5 kPa. The pressing pressure is more preferably from 3.40 kPa to 20.7 kPa in order to satisfy the uniformity of the polishing rate in the surface of the body to be polished and the flatness of the pattern.

During polishing, the polishing liquid is successively supplied to the polishing pad using a pump or the like.

After the completion of polishing, the body to be polished is sufficiently washed with running water, and then dried after removing drops of water adhered on the body to be polished using a spin dryer or the like.

In the present invention, when a concentrated liquid is diluted as in the method of (Case 1.) above, the following aqueous solution may be used. The aqueous solution is prepared in advance by dissolving at least one of an oxidizing agent, an organic acid, an additive, or a surfactant in water. The sum of the components incorporated in the aqueous solution and the components incorporated in the concentrated liquid to be diluted is made to be the components of the polishing liquid used when polishing (liquid to be used).

Thus, in the case of using a concentrated liquid by diluting with an aqueous solution, since components that are hard to dissolve can be blended afterwards in the form of an aqueous solution, a further concentrated liquid can be prepared.

Further, as a method for diluting a concentrated liquid by adding water or an aqueous solution, there is a method in which a concentrated polishing liquid and water or an aqueous solution are mixed, through connecting a pipe that supplies the concentrated polishing liquid and a pipe that supplies water or the aqueous solution on the way in order to join the flow of the liquids, and the mixed and diluted polishing liquid, that is a liquid to be used, is supplied to the polishing pad. As the method for mixing the concentrated liquid and water or the aqueous solution, a generally used method may be applied, such as a method in which the liquids are passed through a narrow passage while applying pressure and mixing the liquids through collision with each other; a method in which a packing material such as a glass tube is packed in the pipe, to thereby repeatedly cause diversion separation and joining of the flow of liquids; or a method in which a blade that rotates by application of motive power is provided in the pipe.

The supplying speed of the polishing liquid is preferably from 10 mL/min to 1,000 mL/min. It is more preferably from 170 mL/min to 800 mL/min in order to satisfy the uniformity of the polishing rate in the surface to be polished of the body to be polished and the flatness of the pattern.

Further, as a method of polishing while diluting a concentrated liquid using water, an aqueous solution, or the like, there is a method in which a pipe that supplies a polishing liquid and a pipe that supplies water or an aqueous solution are independently provided, and a predetermined amount of each liquid is supplied from the respective pipes to a polishing pad, and while mixing the liquids, polishing is carrying out by means of the relative motion between the polishing pad and the surface to be polished. Moreover, a method in which predetermined amounts of a concentrated liquid and water or an aqueous solution are placed and mixed in a single vessel, and then the resulting mixed polishing liquid is supplied to a polishing pad, followed by carrying out polishing, may also be employed.

As another polishing method, there is a polishing method in which the components that should be incorporated in the polishing liquid are divided into at least two constituent component groups, and at the time of using them, the constituent component groups are diluted by adding water or an aqueous solution and supplied to a polishing pad on a polishing platen, then the polishing pad is brought into contact with a surface to be polished, and polishing is carried out by relatively moving the polishing pad and the surface to be polished.

In an embodiment, additives having low solubility may be divided into two constituent component groups (A) and (B). For example, the constituent component group (A) includes an oxidizing agent, an additive, and a surfactant; and the constituent component group (B) includes an organic acid, an additive, a surfactant, and water. At the time of using them, water or an aqueous solution is added, whereby the constituent component group (A) and the constituent component group (B) are diluted, and used.

In the embodiment as described above, three pipes which independently supplies the constituent component group (A), the constituent component group (B), and water or the aqueous solution are needed. For dilution and mixing, there is a method in which the three pipes are connected into one pipe that leads to the polishing pad, and mixing is carried out in the pipe. In this case, it is also possible to connect two pipes of the three pipes first, followed by connecting the other pipe. Specifically, there is a method in which a constituent component group containing additives which are hard to dissolve is mixed with the other constituent component group, so that a mixing path is lengthened for ensuring a sufficient time for dissolution, and then the pipe that supplies water or the aqueous solution is connected.

Other examples of the mixing method include, as described above, a mixing method of directly leading the three pipes respectively to the polishing pad and mixing the liquids by the relative motion between the polishing pad and the surface to be polished, and a method of mixing the three constituent component groups in one vessel, followed by supplying the resulting diluted polishing liquid from the vessel to a polishing pad.

In the polishing method described above, when mixing one constituent component group containing an oxidizing agent and the other constituent component group or when diluting by adding water or an aqueous solution, under the conditions in which the one constituent component group containing an oxidizing agent is adjusted at 40° C. or lower and the other constituent component group is heated at a temperature range of from room temperature to 100° C., the liquid temperature can be made 40° C. or lower. This method is a preferable method for increasing the solubility of a raw material having low solubility in the polishing liquid, by utilizing the phenomenon that solubility becomes higher as the temperature gets higher.

The raw materials that have been dissolved by heating the other constituent component at a temperature range of from room temperature to 100° C. may separate (or precipitate) in the solution when the temperature decreases. Therefore, in the case of using the other constituent components in a low temperature state, the separated raw materials need to be dissolved by heating in advance. For this purpose, a means of conveying the other constituent component in which raw materials have been dissolved by heating, or a means of stirring the liquid containing the deposit, conveying the liquid, and dissolving the deposit by heating a pipe, may be adopted. In a case in which the heated other constituent component and the one constituent component containing an oxidizing agent are mixed, it is preferable that the temperature of the resulting mixture is 40° C. or lower, since there is a possibility that the oxidizing agent decomposes when the heated other constituent component raises the temperature of the one constituent component containing the oxidizing agent to a temperature equal to or higher than 40° C.

Thus, in the present invention, the components of the polishing liquid may be divided into two or more groups, and supplied to the surface to be polished. In this case, it is preferable that the components of the polishing liquid are divided into a constituent component including an oxide and another constituent component including an organic acid, and then supplied. Alternatively, the polishing liquid is prepared as a concentrated liquid, and the concentrated liquid and water for dilution may separately be supplied to the surface to be polished.

In the present invention, in the case of applying the method of supplying the components of the polishing liquid to the surface to be polished through dividing the components of the polishing liquid into two or more groups, the supply amounts thereof indicate the total supply amount of the components supplied from the respective pipes.

Pad

The polishing pad for polishing which is applicable to the polishing method of the present invention may be either a non-foam-structured pad or a foam-structured pad. For the non-foam-structured pad, a hard synthetic resin bulk material such as a plastic plate may be used. The foam-structured pad includes a closed-cell foam (dry foam), an open-cell foam (wet foam), and a two-layered complex (lamination type). Particularly, a two-layered complex (lamination type) is preferable. The foaming may or may not be uniform.

Further, the pad may contain abrasive grains (for example, ceria, silica, alumina, a resin, or the like) that are generally used for polishing. The abrasive grains are classified into soft abrasive grains or hard abrasive grains, and any of them may be used. When a lamination type pad is used, it is preferable the pad has layers having different hardness from each other. As the material of the pad, a non-woven fabric, artificial leather, polyamide, polyurethane, polyester, polycarbonate, or the like is preferable. Moreover, the surface of the polishing pad which contacts with the surface to be polished may be subjected to processing of forming lattice grooves, holes, concentric grooves, spiral grooves, or the like.

Wafer

The diameter of a wafer that serves as the body to be polished, which is an object of performing CMP by using the polishing liquid of the invention, is preferably 200 mm or more, and particularly preferably 300 mm or more. When the diameter is 300 mm or more, the effects of the present invention may be remarkably demonstrated.

Polishing Apparatus

The apparatus capable of carrying out polishing using the polishing liquid of the present invention is not particularly limited. Examples thereof include MA-300D (trade name, manufactured by Musashino Denshi Co., Ltd.), MIRRA MESA CMP and REFLEXION CMP (all trade names, manufactured by Applied Materials, Inc.), FREX200 and FREX300 (all trade names, manufactured by Ebara Corporation), NPS3301 and NPS2301 (all trade names, manufactured by Nikon Corporation), A-FP-310A and A-FP-210A (all trade names, manufactured by Tokyo Seimitsu Co., Ltd.), 2300 TERES (trade name, manufactured by Lam Research Co., Ltd.), and MOMENTUM (trade name, manufactured by SeedFam IPEC, Inc.).

EXAMPLES

Hereinafter, the present invention will be specifically described with respect to Examples, but the present invention is not limited to the following Examples unless departs from the subject matter of the invention.

Example 1

Preparation of Polishing Liquid

A polishing liquid having the following composition and pH was prepared.
Polishing Liquid Composition

| | |
|---|---|
| Colloidal silica particles: A4 | 100 g/L |
| Colloidal silica particles: A8 | 100 g/L |
| Phosphonic acid B: exemplary compound B10 | 10 g/L |
| Anionic surfactant: P7 | 4.5 g/L |
| Pure water | added to give 1,000 mL in total |

(pH (adjusted using ammonia water and nitric acid) 2.5)

Colloidal silica particles (A1 to A9) used for each Example in this specification are as shown in the following Table 1. Note that, A1 to A9 are products manufactured by FUSOU CHEMICAL Co., Ltd.

It should be noted that the average primary particle diameters and the average secondary particle diameters in Table 1 are average values of the results obtained by observation of polishing particles using an SEM (scanning electron microscope).

TABLE 1

| Abrasive Particles No. | Trade Name | Average Primary Particle Diameter (nm) | Average Secondary Particle Diameter (nm) |
|---|---|---|---|
| A1 | PL3 | 35 | 70 |
| A2 | PL3L | 35 | — |
| A3 | PL3H | 25 | 75 |
| A4 | PL2 | 25 | 45 |
| A5 | PL2L | 25 | — |
| A6 | PL2H | 20 | 40 |
| A7 | PL1 | 15 | 25 |
| A8 | PL1H | 10 | 25 |
| A9 | PL3 (Anion sol) | 35 | 70 |

Evaluation Method
Polishing Apparatus

"MA-300D" (trade name) manufactured by Musashino Denshi Co., Ltd. was used as the polishing apparatus. While supplying the slurry under the following conditions, polishing was carried out under the following conditions, using the wafer described below as the polishing object. Thereby, evaluation of the polishing liquid was performed.

| | |
|---|---|
| Number of rotations of table: | 112 rpm |
| Number of rotations of head: | 113 rpm |
| Polishing pressure: | 18.4 kPa |
| Polishing pad: | IC1400 XY-K-Pad (trade name) manufactured by Rodel Nitta Company |
| Supplying speed of polishing liquid: | 50 mL/min |

Polishing Object

As the polishing objects, cut wafers which were obtained by cutting an 8-inch wafer into 6 cm×6 cm pieces were used, in which the 8-inch wafer was prepared by forming a polysilicon layer (p-Si layer), a silicon oxide layer ($SiO_2$ layer), or a silicon nitride layer ($Si_3N_4$ layer), respectively, on an Si substrate.

Polishing Rate and Polishing Rate Ratio

With regard to each of the polysilicon layer (p-Si layer), the silicon oxide layer ($SiO_2$ layer), and the silicon nitride layer ($Si_3N_4$ layer), the layer thicknesses (nm) before and after polishing were measured, and the polishing rate for each layer was calculated according to the following equation. The layer thicknesses were each measured using a non-contact type film thickness meter FE-33 (trade name, manufactured by Otsuka Electronics Co., Ltd.).

Polishing rate(nm/min)=(Layer thickness before polishing−Layer thickness after polishing)/Polishing time Further, with regard to the p-Si layer and the $SiO_2$ layer, and the p-Si layer and the $Si_3N_4$ layer, the polishing rate ratios each represented by RR(other)/RR(p-Si) were calculated.

The obtained results are shown in Table 2.

Examples 2 to 21 and Comparative Examples 1 to 3

Preparation of polishing liquids of Examples 2 to 21 and Comparative Examples 1 to 3 was conducted in the same manner as in the preparation of the polishing liquid of Example 1, except that the colloidal silica particles, the anionic surfactant, and the organic acid in the preparation of the polishing liquid of Example 1 were replaced by the components described in the following Table 2, and the pH was adjusted to the value shown in Table 2. The polishing liquids of Examples 2 to 21 and Comparative Examples 1 to 3 thus obtained were evaluated in the same manner as in Example 1. The experimental results are shown in Table 2. Note that, in Example 1, two kinds of abrasive grains were used.

It should be noted that the abrasive particles A1 to A9 in Table 2 and Table 3 are as shown in Table 1, and the organic acids B1 to B3 are the compounds described above as the examples of organic phosphonic acid. Further, the anionic surfactants P3, and P5 to P9 are the compounds described above as the examples of anionic surfactant.

The ζ potential of the particles was measured by the following method.

Here, in the present invention, the ζ potential of the surface of colloidal silica was measured and evaluated using undiluted evaluation liquids and using DT-1200 (trade name, manufactured by Nihon Rufuto Co., Ltd.).

TABLE 2

| No. | Abrasive Particles (Content) (g/L) | Phosphonic Acid B (Content) (g/L) | Anionic Surfactant (Content) (g/L) | pH | ζ Potential of Particles (mV) | Polishing Rate | | | Polishing Rate Ratio | |
|---|---|---|---|---|---|---|---|---|---|---|
| | | | | | | p-Si (nm/min) | $SiO_2$ (nm/min) | $Si_3N_4$ (nm/min) | $RR(SiO_2)/RR(p-Si)$ | $RR(Si_3N_4)/RR(p-Si)$ |
| Example 1 | A4 (100) A8 (100) | B10 (10.0) | P7 (4.5) | 2.5 | −27 | 11 | 31 | 58 | 2.82 | 5.27 |
| Example 2 | A8 (150) | B13 (12.0) | P7 (3.5) | 3.0 | −31 | 10 | 39 | 54 | 3.90 | 5.40 |
| Example 3 | A7 (150) | B10 (10.0) | P8 (1.5) | 2.0 | −23 | 14 | 37 | 65 | 2.64 | 4.64 |
| Example 4 | A3 (150) | B10 (10.0) | P7 (3.5) | 3.5 | −27 | 10 | 39 | 51 | 3.90 | 5.10 |
| Example 5 | A2 (150) | Phosphoric acid (5.2) | P5 (4.5) | 3.5 | −25 | 11 | 42 | 50 | 3.82 | 4.55 |
| Example 6 | A5 (150) | B13 (12.0) | P6 (2.0) | 4.5 | −32 | 11 | 43 | 45 | 3.91 | 4.09 |
| Example 7 | A1 (150) | Phosphoric acid (5.2) | P9 (4.5) | 3.0 | −32 | 7 | 43 | 65 | 6.14 | 9.29 |
| Example 8 | A3 (150) | B13 (12.0) | P5 (4.5) | 2.5 | −28 | 12 | 38 | 59 | 3.17 | 4.92 |
| Example 9 | A5 (150) | B15 (20.0) | P7 (3.5) | 3.5 | −25 | 11 | 32 | 56 | 2.91 | 5.09 |
| Example 10 | A2 (150) | Phosphoric acid (5.2) | P9 (4.5) | 4.0 | −23 | 6 | 34 | 58 | 5.67 | 9.67 |
| Example 11 | A1 (150) | B10 (10.0) | P8 (1.5) | 3.0 | −25 | 12 | 35 | 57 | 2.92 | 4.75 |
| Example 12 | A3 (150) | B10 (10.0) | P5 (4.5) | 2.5 | −27 | 11 | 37 | 63 | 3.36 | 5.73 |
| Example 13 | A7 (150) | B15 (20.0) | P9 (4.5) | 3.0 | −25 | 8 | 36 | 59 | 4.50 | 7.38 |
| Example 14 | A4 (150) | Phosphoric acid (5.2) | P9 (4.5) | 5.0 | −35 | 9 | 34 | 61 | 3.78 | 6.78 |
| Example 15 | A2 (150) | B13 (12.0) | P7 (3.5) | 3.0 | −25 | 15 | 47 | 59 | 3.13 | 3.93 |
| Example 16 | A6 (150) | B15 (20.0) | P6 (2.0) | 2.0 | −28 | 14 | 31 | 68 | 2.21 | 4.86 |
| Example 17 | A8 (150) | B15 (20.0) | P9 (4.5) | 4.5 | −27 | 8 | 42 | 63 | 5.25 | 7.88 |

TABLE 2-continued

| No. | Abrasive Particles (Content) (g/L) | Phosphonic Acid B (Content) (g/L) | Anionic Surfactant (Content) (g/L) | pH | ζ Potential of Particles (mV) | Polishing Rate p-Si (nm/min) | Polishing Rate SiO$_2$ (nm/min) | Polishing Rate Si$_3$N$_4$ (nm/min) | Polishing Rate Ratio RR(SiO$_2$)/ RR(p-Si) | Polishing Rate Ratio RR(Si$_3$N$_4$)/ RR(p-Si) |
|---|---|---|---|---|---|---|---|---|---|---|
| Example 18 | A4 (150) | B10 (10.0) | P6 (2.0) | 4.0 | −24 | 13 | 43 | 62 | 3.31 | 4.77 |
| Example 19 | A5 (150) | B10 (10.0) | P6 (2.0) | 3.0 | −25 | 12 | 38 | 54 | 3.17 | 4.50 |
| Example 20 | A1 (150) | B13 (12.0) | P6 (2.0) | 3.0 | −29 | 11 | 37 | 53 | 3.36 | 4.82 |
| Example 21 | A6 (150) | B15 (20.0) | P9 (4.5) | 2.5 | −23 | 7 | 42 | 52 | 6.00 | 7.43 |
| Comparative Example 1 | — | Phosphoric acid (5.2) | P3 (4.5) | 3.0 | — | 1 | 0.3 | 0 | 0.30 | 0.00 |
| Comparative Example 2 | A1 (150) | B10 (10.0) | — | 3.0 | −34 | 40 | 43 | 72 | 1.08 | 1.80 |
| Comparative Example 3 | A1 (150) | — | P3 (4.5) | 3.0 | +1 | 42 | 21 | 10 | 0.50 | 0.24 |

As is evident from Table 2, in the Examples, the polishing rates of silicon oxide and silicon nitride were high, and polishing of the polysilicon layer was selectively suppressed. Thus, it is understood that, by using the polishing liquids of the Examples, excessive polishing of the polysilicon film was suppressed.

Examples 22 and 23

Preparation of polishing liquids of Examples 22 and 23 was conducted in the same manner as in the preparation of the polishing liquid of Example 1, except that the colloidal silica particles, the anionic surfactant, and the organic acid in the preparation of the polishing liquid of Example 1 were replaced by the components described in the following Table 3, and the pH was adjusted to the value shown in Table 3. The polishing liquids of Examples 22 and 23 thus obtained were evaluated in the same manner as in Example 1, except that the polishing objects were changed to the following wafers.

As the polishing objects used in Examples 22 and 23, cut wafers which were obtained by cutting 8-inch wafers into 6 cm×6 cm pieces were used, in which the 8-inch wafers were prepared by forming a film of polysilicon (p-Si layer), silicon oxycarbide (SiOC layer), silicon oxynitride (SiON layer), silicon carbide (SiC layer), or silicon carbonitride (SiCN), respectively, on an Si substrate.

The experimental results are shown in Table 4, and the polishing rate ratios are shown in Table 5.

TABLE 3

| No. | Abrasive Particles (Content) (g/L) | Phosphonic Acid B (Content) (g/L) | Anionic Surfactant (Content) (g/L) | pH | ζ Potential of Particles (mV) |
|---|---|---|---|---|---|
| Example 22 | A4 (150) | B10 (10.0) | P6 (2.0) | 3.0 | −35 |
| Example 23 | A4 (150) | Phosphoric acid (5.2) | P9 (4.5) | 2.0 | −25 |

TABLE 4

| No. | Polishing Rate p-Si (nm/min) | Polishing Rate SiOC (nm/min) | Polishing Rate SiON (nm/min) | Polishing Rate SiC (nm/min) | Polishing Rate SiCN (nm/min) |
|---|---|---|---|---|---|
| Example 22 | 4 | 30 | 45 | 25 | 28 |
| Example 23 | 7 | 31 | 43 | 22 | 35 |

TABLE 5

| No. | Polishing Rate Ratio RR(SiOC)/ RR(p-Si) | Polishing Rate Ratio RR(SiON)/ RR(p-Si) | Polishing Rate Ratio RR(SiC)/ RR (p-Si) | Polishing Rate Ratio RR(SiCN)/ RR(p-Si) |
|---|---|---|---|---|
| Example 22 | 7.5 | 11.3 | 6.3 | 7.0 |
| Example 23 | 4.4 | 6.1 | 3.1 | 5.0 |

As is evident from Table 4, in the Examples, the polishing rates of silicon oxycarbide, silicon oxynitride, silicon carbide, and silicon carbonitride were high, and polishing of the polysilicon layer was selectively suppressed. Thus, it is understood that, by using the polishing liquids of the Examples, excessive polishing of the polysilicon film was suppressed.

What is claimed is:

1. A polishing liquid which is used for chemical mechanical polishing of a body to be polished in a planarization process for fabrication of a semiconductor integrated circuit, in which the body to be polished comprises at least a first layer comprising polysilicon or a polysilicon doped with an impurity element of P or B, and a second layer comprising at least one selected from the group consisting of silicon oxide, silicon nitride, silicon carbide, silicon carbonitride, silicon oxycarbide, and silicon oxynitride, wherein the polishing liquid comprises the following components (A), (B), and (C), has a pH of from 1.5 to 7.0, and selectively polishes the second layer with respect to the first layer:

(A) colloidal silica particles having a negative ζ potential;
(B) phosphoric acid or an organic phosphonic acid compound represented by the following Formula (1) or Formula (2):

  Formula (1):

  Formula (2):

wherein, in Formula (1), a represents 1 or 2; $R^2$ and $R^3$ each independently represent a hydrogen atom, a hydroxy group, a carboxyl group, a phenyl group, or a substituted or unsubstituted alkyl group having from 1 to 6 carbon atoms; and a substituent for the substituted alkyl group is a hydroxy group, an amino group, a carboxyl group, a hydroxyamino group, a phosphonic acid group, or a phenyl group; and in Formula (2), $R^4$ represents a substituted or unsubstituted alkyl group having 1 to 6 carbon atoms, —(CH$_2$—PO$_3$H$_2$), or -A-N(R$^5$)$_p$—(CH$_3$—PO$_3$H$_2$)$_q$; A represents a single bond or an alkylene group having from 1 to 4 carbon atoms; R⁵ represents a substituted or unsubstituted alkyl group having from 1 to 6 carbon atoms or —(CH₂—PO₃H₂); m represents 0 or 1, n represents 1 or 2, and m+n=2; and p represents 0 or 1, q represents 1 or 2, and p+q=2; and (C) an anionic surfactant having at least one group represented by the following Formula (I), Formula (II), Formula (III), or Formula (IV):

—PO₃X₂  Formula (I):

—OPO₃X₂  Formula (II):

—COOX  Formula (III):

—SO₃X  Formula (IV):

wherein, in Formulae (I) to (IV), each X independently represents a hydrogen atom, lithium, sodium, potassium, or a quaternary ammonium cation, and wherein the polishing liquid is configured such that, when the second layer comprises silicon oxide and silicon nitride, the body is polished at a ratio represented by RR(silicon oxide)/RR(p-Si) in a range of from 1.5 to 200, and a ratio RR(silicon nitride)/RR(p-Si) in a range of from 1.5 to 200, RR(p-Si) indicating a polishing rate of the first layer, and RR(silicon oxide) and RR(silicon nitride) respectively indicating polishing rates of the silicon oxide and silicon nitride in the second layer.

2. The polishing liquid according to claim 1, wherein the polishing liquid is configured to polish the body at a ratio represented by RR(other)/RR(p-Si) in a range of from 1.5 to 200, wherein RR(p-Si) indicates a polishing rate of the first layer and RR(other) indicates a polishing rate of the second layer.

3. The polishing liquid according to claim 1, wherein the concentration of the colloidal silica particles is in a range of from 0.1% by mass to 10% by mass with respect to the total mass of the polishing liquid.

4. The polishing liquid according to claim 1, wherein the colloidal silica particles have an average primary particle diameter of from 5 nm to 100 nm and an average secondary particle diameter of from 10 nm to 300 nm.

5. The polishing liquid according to claim 1, wherein the ζ potential of the (A) colloidal silica particles is in a range of from −50 mV to −5 mV.

6. The polishing liquid according to claim 1, wherein the (B) organic phosphonic acid compound comprises at least one compound selected from the group consisting of the following B10, B13, and B15:

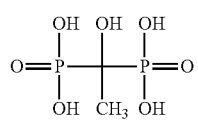

B10

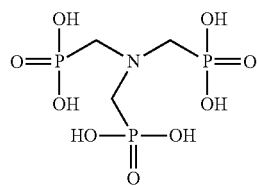

B13

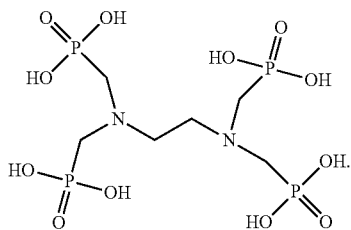

B15

7. The polishing liquid according to claim 1, wherein the concentration of the (C) anionic surfactant is in a range of from 0.001% by mass to 1% by mass with respect to the total mass of the polishing liquid.

8. The polishing liquid according to claim 1, wherein the (C) anionic surfactant comprises a compound having two or more groups independently selected from the group consisting of groups represented by Formula (I) to Formula (IV).

9. A chemical mechanical polishing method for polishing a body to be polished having at least a first layer comprising polysilicon or a polysilicon doped with an impurity element of P or B, and a second layer comprising at least one selected from the group consisting of silicon oxide, silicon nitride, silicon carbide, silicon carbonitride, silicon oxycarbide, and silicon oxynitride, wherein the polishing method comprises:

(a) bringing a surface of the body to be polished into contact with a polishing pad and a polishing liquid according to claim 1, and (b) moving the polishing pad and the body to be polished relatively to each other, while bringing a portion of the polishing liquid according to claim 1 into contact with the surface of the body to be polished between the polishing pad and the body to be polished, for a period sufficient for carrying out polishing of the second layer.

10. The polishing method according to claim 9, with which the body to be polished is polished at a ratio represented by RR(other)/RR(p-Si) in a range of from 1.5 to 200, wherein RR(p-Si) indicates a polishing rate of the first layer and RR(other) indicates a polishing rate of the second layer.

11. The polishing method according to claim 9, wherein the concentration of the colloidal silica particles is in a range of from 0.1% by mass to 10% by mass with respect to the total mass of the polishing liquid.

12. The polishing method according to claim 9, wherein the colloidal silica particles have an average primary particle diameter of from 5 nm to 100 nm and an average secondary particle diameter of from 10 nm to 300 nm.

13. The polishing method according to claim 9, wherein the ζ potential of the colloidal silica particles is in a range of from −50 mV to −5 mV.

14. The polishing method according to claim 9, wherein the organic phosphonic acid compound comprises at least one compound independently selected from the group consisting of the following B10, B13, and B15:

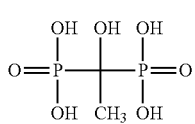

B10

-continued

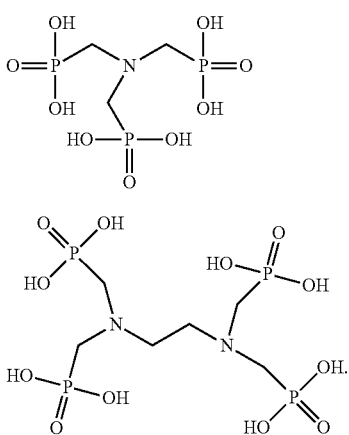

B13

B15

15. The polishing method according to claim 9, wherein the concentration of the anionic surfactant is in a range of from 0.001% by mass to 1% by mass with respect to the total mass of the polishing liquid.

16. The polishing method according to claim 9, wherein the (C) anionic surfactant comprises a compound having two or more groups independently selected from the group consisting of groups represented by Formula (I) to Formula (IV).

17. The polishing liquid according to claim 1, wherein the colloidal silica particles have an average primary particle diameter of from 35 nm to 100 nm.

18. The polishing liquid according to claim 1, wherein the pH is of from 5 to 7.0.

19. The polishing liquid according to claim 1, wherein the polishing liquid consists essentially of the following components (A), (B), (C), (D) and (E):

(A) colloidal silica particles having a negative ζ potential;
(B) phosphoric acid or an organic phosphonic acid compound represented by the following Formula (1) or Formula (2):

$$R^2—C(R^3)_{3-a}—(PO_3H_2)_a$$ Formula (1):

$$R^4—N(R^5)_m—(CH_2—PO_3H_2)_n$$ Formula (2):

wherein, in Formula (1), a represents 1 or 2; $R^2$ and $R^3$ each independently represent a hydrogen atom, a hydroxy group, a carboxyl group, a phenyl group, or a substituted or unsubstituted alkyl group having from 1 to 6 carbon atoms; and a substituent for the substituted alkyl group is a hydroxy group, an amino group, a carboxyl group, a hydroxyamino group, a phosphonic acid group, or a phenyl group; and in Formula (2), $R^4$ represents a substituted or unsubstituted alkyl group having 1 to 6 carbon atoms, —($CH_2$—$PO_3H_2$), or -A-N($R^5$)$_p$—($CH_2$—$PO_3H_2$)$_q$; A represents a single bond or an alkylene group having from 1 to 4 carbon atoms; $R^5$ represents a substituted or unsubstituted alkyl group having from 1 to 6 carbon atoms or —($CH_2$—$PO_3H_2$); m represents 0 or 1, n represents 1 or 2, and m+n=2; and p represents 0 or 1, q represents 1 or 2, and p+q=2;

(C) an anionic surfactant having at least one group represented by the following Formula (I), Formula (II), Formula (III), or Formula (IV):

—$PO_3X_2$ Formula (I):

—$OPO_3X_2$ Formula (II):

—COOX Formula (III):

—$SO_3X$ Formula (IV):

wherein, in Formulae (I) to (IV), each X independently represents a hydrogen atom, lithium, sodium, potassium, or a quaternary ammonium cation (D) a pH adjusting agent; and
(E) water.

20. A chemical mechanical polishing liquid, to be used when planarizing a body during fabrication of a semiconductor integrated circuit, the body comprising at least a first layer comprising polysilicon or a polysilicon doped with an impurity element of P or B, and a second layer comprising at least one selected from the group consisting of silicon oxide, silicon nitride, silicon carbide, silicon carbonitride, silicon oxycarbide, and silicon oxynitride, the polishing liquid consisting of the following components (A), (B), (C), (D) and (E):

(A) colloidal silica particles having a negative ζ potential;
(B) phosphoric acid or an organic phosphonic acid compound represented by the following Formula (1) or Formula (2):

$$R^2—C(R^3)_{3-a}—(PO_3H_2)_a$$ Formula (1):

$$R^4—N(R^5)_m—(CH_2—PO_3H_2)_n$$ Formula (2):

wherein, in Formula (1), a represents 1 or 2; $R^2$ and $R^3$ each independently represent a hydrogen atom, a hydroxy group, a carboxyl group, a phenyl group, or a substituted or unsubstituted alkyl group having from 1 to 6 carbon atoms; and a substituent for the substituted alkyl group is a hydroxy group, an amino group, a carboxyl group, a hydroxyamino group, a phosphonic acid group, or a phenyl group; and in Formula (2), $R^4$ represents a substituted or unsubstituted alkyl group having 1 to 6 carbon atoms, —($CH_2$—$PO_3H_2$), or -A-N($R^5$)$_p$—($CH_2$—$PO_3H_2$)$_q$; A represents a single bond or an alkylene group having from 1 to 4 carbon atoms; $R^5$ represents a substituted or unsubstituted alkyl group having from 1 to 6 carbon atoms or —($CH_2$—$PO_3H_2$); m represents 0 or 1, n represents 1 or 2, and m+n=2; and p represents 0 or 1, q represents 1 or 2, and p+q=2;

(C) an anionic surfactant having at least one group represented by the following Formula (I), Formula (II), Formula (III), or Formula (IV):

—$PO_3X_2$ Formula (I):

—$OPO_3X_2$ Formula (II):

—COOX Formula (III):

—$SO_3X$ Formula (IV):

wherein, in Formulae (I) to (IV), each X independently represents a hydrogen atom, lithium, sodium, potassium, or a quaternary ammonium cation;

(D) a pH adjusting agent; and
(E) water.

21. The polishing liquid according to claim 1, wherein an anionic compound is adsorbed onto a surface of the colloidal silica particles.

22. The polishing liquid according to claim 2, wherein when the second layer comprises silicon dioxide, the ratio represented by RR(other)/RR(p-Si) in a range of from 3.31 to 200.

* * * * *